(12) United States Patent
Wu

(10) Patent No.: US 11,133,384 B1
(45) Date of Patent: Sep. 28, 2021

(54) QUANTUM WIRE RESONANT TUNNELING TRANSISTOR

(71) Applicant: Koucheng Wu, Renton, WA (US)

(72) Inventor: Koucheng Wu, Nantou County (TW)

(73) Assignee: Koucheng Wu, Nantou County (TW)

( * ) Notice: Subject to any disclaimer, the term of this patent is extended or adjusted under 35 U.S.C. 154(b) by 0 days.

(21) Appl. No.: 16/852,493

(22) Filed: Apr. 19, 2020

(51) Int. Cl.
| H01L 29/06 | (2006.01) |
| H01L 29/08 | (2006.01) |
| H01L 29/10 | (2006.01) |
| H01L 29/16 | (2006.01) |
| H01L 29/423 | (2006.01) |
| H01L 29/73 | (2006.01) |
| H01L 29/66 | (2006.01) |
| H01L 29/04 | (2006.01) |
| H01L 29/417 | (2006.01) |

(52) U.S. Cl.
CPC .......... *H01L 29/0676* (2013.01); *H01L 29/04* (2013.01); *H01L 29/0804* (2013.01); *H01L 29/0821* (2013.01); *H01L 29/1004* (2013.01); *H01L 29/1602* (2013.01); *H01L 29/41708* (2013.01); *H01L 29/42304* (2013.01); *H01L 29/66234* (2013.01); *H01L 29/73* (2013.01)

(58) Field of Classification Search
CPC . H01L 29/0676; H01L 29/0821; H01L 29/73; H01L 29/1004; H01L 29/04; H01L 29/66234; H01L 29/42304; H01L 29/41708; H01L 29/0804; H01L 29/1602
See application file for complete search history.

(56) References Cited

U.S. PATENT DOCUMENTS

| 5,844,253 | A | * | 12/1998 | Kim | ....................... | B82Y 10/00 257/24 |
| 6,744,111 | B1 | * | 6/2004 | Wu | ....................... | H01L 21/84 257/471 |
| 2008/0179586 | A1 | * | 7/2008 | Kamins | .................. | B82Y 10/00 257/9 |

FOREIGN PATENT DOCUMENTS

WO WO-2007057802 A1 * 5/2007 ............. B82Y 10/00

* cited by examiner

*Primary Examiner* — Syed I Gheyas
(74) *Attorney, Agent, or Firm* — SV Patent Service

(57) ABSTRACT

A semiconductor transistor device includes an emitter region that includes a plurality of metal quantum wires and is connected to an emitter terminal, a base region that includes a plurality of metal quantum wires and is connected to a base terminal, a collector region comprising a plurality of metal quantum wires and is connected to a collector terminal, an emitter barrier region between the emitter region and the base region, and a collector barrier region between the collector region and the base region.

20 Claims, 6 Drawing Sheets

QUANTUM WIRE RESONANT TUNNELING TRANSISTOR

TECHNICAL FIELD

This application relates generally to a semiconductor device, and more specifically to a semiconductor transistor device suitable for digital circuits.

BACKGROUND OF THE INVENTION

The MOSFET constitutes the fundamental building block of semiconductor technology. A large part of its success is due to the fact that it can be continuously scaled down to smaller dimensions while increasing circuit performance and lowering manufacturing cost. After more than 50 years of miniaturization, the benefits from device scaling have gradually diminished. The traditional device scaling may no longer be economically justified. MOS device scaling could stop in the near future according to 2015 International Technology Roadmap for Semiconductors (ITRS) (R. Courtland, "Transistors Could Stop Shrinking in 2021," *IEEE Spectrum*, vol. 53, no. 9, pp. 9-11, September 2016, doi: 10.1109/MSPEC.2016.7551335, and also International Technology Roadmap for Semiconductors, 2015 Edition, available: http://www.itrs2.net/). The motivation of creating a new transistor in this invention is to provide a low-cost and high-performance transistor to meet the increasing demand for computing power in the information age.

SUMMARY OF INVENTION

The details of one or more embodiments are set forth in the accompanying drawing and in the description below. Other features, objects, and advantages of the invention will become apparent from the description and drawings, and from the claims.

In one general aspect, the present invention relates to a semiconductor transistor device that includes an emitter region that includes a plurality of metal quantum wires, a base region that includes a plurality of metal quantum wires, a collector region that includes a plurality of metal quantum wires, an emitter barrier region between the emitter region and the base region; and a collector barrier region between the collector region and the base region.

Implementations of the system may include one or more of the following. The emitter region, the base region, and the collector region can include a crystalline semiconductor that includes open channels in a crystal lattice, wherein the metal quantum wires can be formed along the open channels of the crystalline semiconductor. The open channel direction can be the <110> direction for semiconductors with a diamond cubic lattice structure. The metal quantum wires in the emitter region, the base region, and the collector region can be formed by ion implantation of metal ions respectively into the emitter region, the base region, and the collector region. The crystalline semiconductor can be in the form of a semiconductor layer, wherein the metal quantum wires are disposed from a bottom surface of the layer to a top surface of the semiconductor layer. The semiconductor transistor device can further include an emitter terminal connected to the emitter region, a base terminal connected to the base region, and a collector terminal connected to the collector region, wherein the metal quantum wires in the emitter region, the base region, and the collector region can be respectively connected to the emitter terminal, the base terminal, and the collector terminal at the top surface of the semiconductor layer. The metal quantum wires can have lengths shorter than 500 Å. The emitter region, the base region, and the collector region can each include a semiconductor in which the plurality of metal quantum wires are embedded. The semiconductor can include silicon, germanium, silicon germanium alloys, diamond, and III-V compound semiconductors. The plurality of metal quantum wires in the emitter region, the base region, or the collector region can be substantially parallel to each other. The plurality of metal quantum wires in the emitter region, the base region, or the collector region can be distributed periodically. The emitter barrier region or the collector barrier region can have a width smaller than 100 Å. The base region can produce a tunneling current through the emitter barrier region and the collector barrier region in response to a voltage applied to the base region. The Fermi level [A work function] of the metal quantum wires can be closer to the conduction band edge than to the valence band edge in at least one of the emitter barrier region or the collector barrier region, wherein a tunnel current between the emitter region and the collector region can have electrons as majority carriers. The Fermi level [A work function] of the metal quantum wires can be closer to the valence band edge than to the conduction band edge in at least one of the emitter barrier region or the collector barrier region, wherein a tunnel current between the emitter region and the collector region can have holes as majority carriers. The metal quantum wires in the emitter region, the base region, and the collector region can be made of a same metal. The metal quantum wires in the emitter region, the base region, and the collector region can be made of different metals. Ground state energies in the metal quantum wires in the emitter region, the [emitter] base region, and the collector region can have substantially a same value. Ground state energies in the metal quantum wires in the emitter region, the [emitter] base region, and the collector region can have different values.

In another general aspect, the present invention relates to a semiconductor transistor device that includes an emitter region comprising a plurality of metal quantum wires, a first base region comprising a plurality of metal quantum wires, a second base region comprising a plurality of metal quantum wires, a collector region comprising a plurality of metal quantum wires [and connected to a collector terminal], an emitter barrier region between the emitter region and the first base region, an inter-base barrier region between the first base region and the second base region, and a collector barrier region between the collector region and the second base region.

BRIEF DESCRIPTION OF THE DRAWINGS

The accompanying drawing, which are incorporated in and form a part of this specification, illustrate embodiments of the invention and, together with the description, serve to explain the principles of the invention.

DETAILED DESCRIPTION OF THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Figure 1:
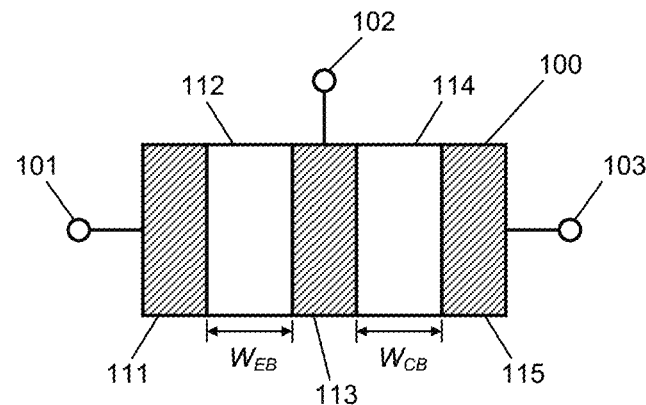
FIG. 1 shows the schematic drawing of a Quantum Wire Resonant Tunneling Transistor (QWRTT).

Quantum Wire Resonant Tunneling Transistor (QWRTT) is a three-terminal device. FIG. 1 shows the schematic drawing of a QWRTT 100. The three terminals include emitter terminal 101, base terminal 102, and collector terminal 103. The device structure of the QWRTT 100 consists of emitter region 111, emitter barrier region 112, base region 113, collector barrier region 114, and collector region 115. The emitter region 111, base region 113, and collector region 115 each includes a semiconductor embedded with two or more metal quantum wires. The semiconductor in the emitter region 111, base region 113, and collector region 115 can be, for example, silicon, germanium, or silicon germanium alloys. The emitter barrier region 112 and collector barrier region 114 are made of one or more semiconductor materials such as silicon, germanium, silicon germanium alloys, diamond, or III-V compound semiconductors. The semiconductor can be undoped or lightly doped. $W_{EB}$ is the width of the emitter barrier region 112, and $W_{CB}$ is the width of the collector barrier region 114.

Figure 2A:
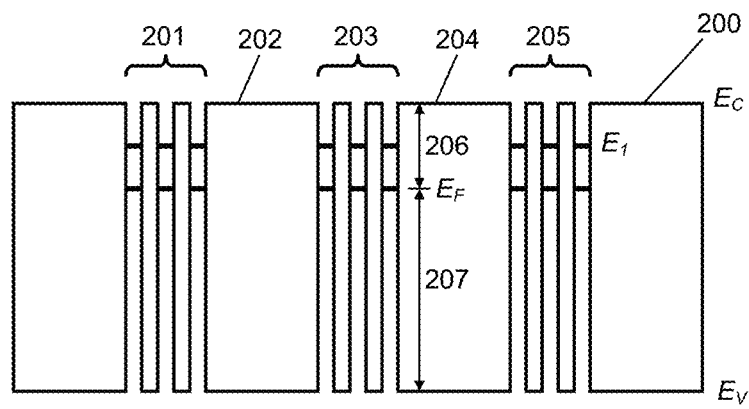
FIG. 2a shows the band diagram of an n-type QWRTT.
Figure 2B:
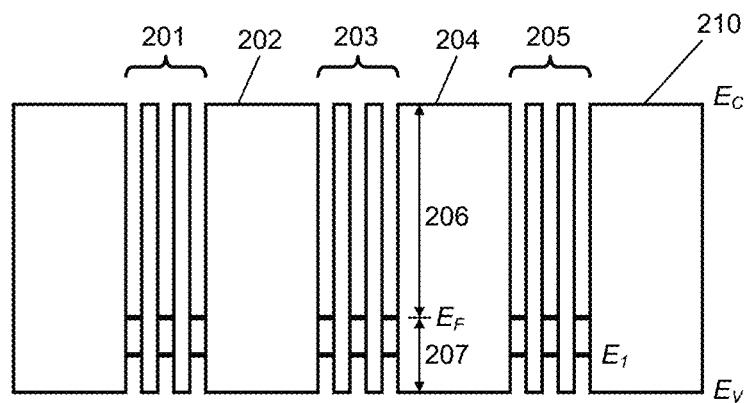
FIG. 2b shows the band diagram of a p-type QWRTT.

The QWRTT has two complementary device types, i.e. n-type and p-type. The primary carriers are electrons in an n-type QWRTT, and holes in a p-type QWRTT. FIG. 2a shows the band diagram of an n-type QWRTT 200, and FIG. 2b shows the band diagram of a p-type QWRTT 210. The n-type QWRTT 200 and the p-type QWRTT 210 each includes the emitter region 201, emitter barrier region 202, base region 203, collector barrier region 204, and collector region 205. $E_C$ is the conduction band edge, and $E_V$ is the valence band edge of the semiconductor. $E_F$ is the Fermi level of the metal that forms the quantum wires. For an n-type device shown in FIG. 2a, $E_F$ is closer to $E_C$ than $E_V$, the Schottky barrier height for electrons $q\phi_{bn}$ 206 is smaller than the Schottky barrier height for holes $q\phi_{bp}$ 207, and the primary carriers are electrons. While for a p-type device shown in FIG. 2b, $E_F$ is closer to $E_V$ than $E_C$, $q\phi_{bp}$ 207 is smaller than $q\phi_{bn}$ 206, and the primary carriers are holes.

Figure 3A:
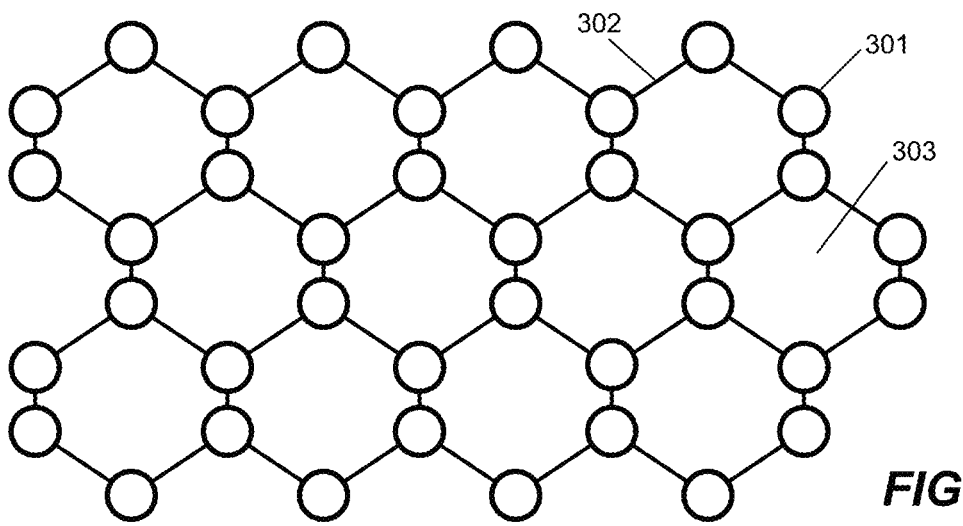
FIG. 3a shows a silicon lattice structure viewed in the <110> direction.
Figure 3B:
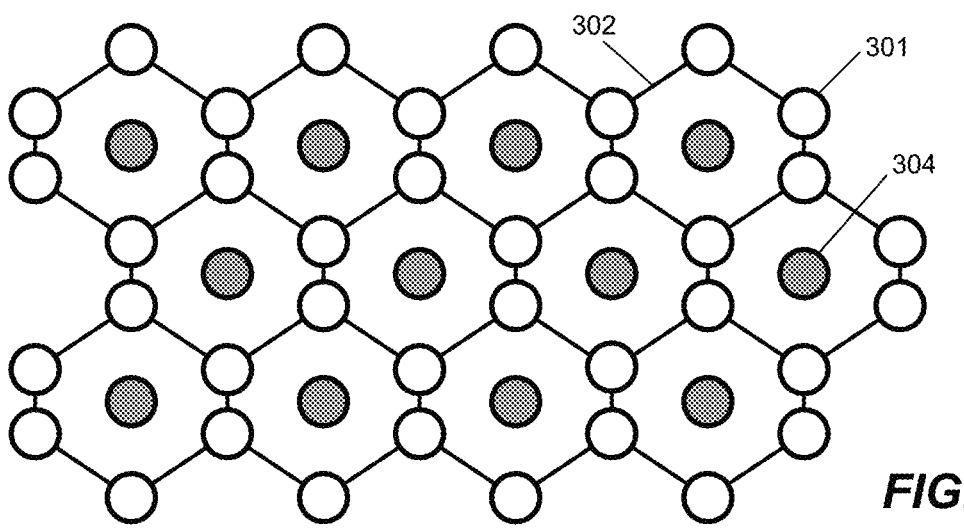
FIG. 3b shows the same silicon lattice structure after ion implantation.

Silicon has a diamond cubic lattice structure, which is a very open structure with an atomic packing factor of 0.34. FIG. 3a shows the silicon lattice structure viewed in the <110> direction. A honeycomb structure formed by silicon atoms 301 can be seen. The honeycomb structure has an array of hexagonal hollow cells 302. Each cell has a large opening at the center. The opening forms an open channel 303 in the ion implantation process. In the example of silicon, the open channels are oriented along the <110> direction and are substantially parallel to each other. If ions of light elements are implanted along the open channel direction, the ions will be steered along such open channels without encountering any target nuclei. The implant range can be much longer than other directions. This effect is called ion channeling. It is an undesirable effect for most semiconductor processes. However, this unfavorable ion channeling effect can be used to create quantum wires of atomic size. FIG. 3b shows the silicon lattice structure viewed in the <110> direction after ion implantation. Metal atoms 304 are embedded in the open channels 303 as shown in FIG. 3b. A quantum wire is formed when the metal atoms 304 in an open channel 303 are continuously distributed and electrically connected.

Figure 4A:
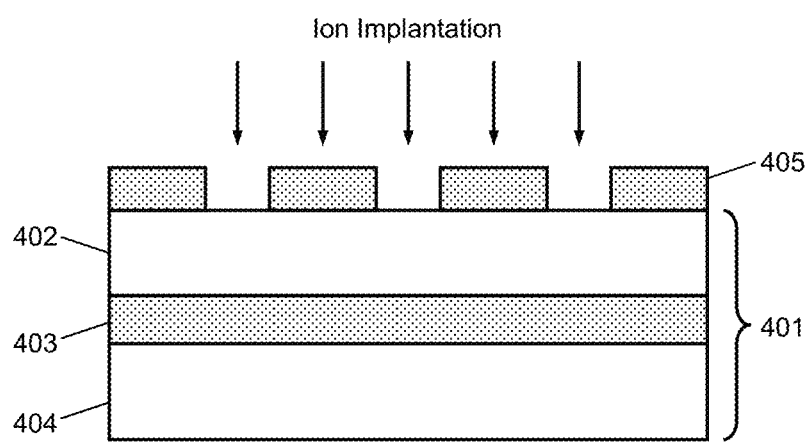
FIG. 4a shows the layer structure of an exemplary fabrication process at the step of ion implantation.
Figure 4B:
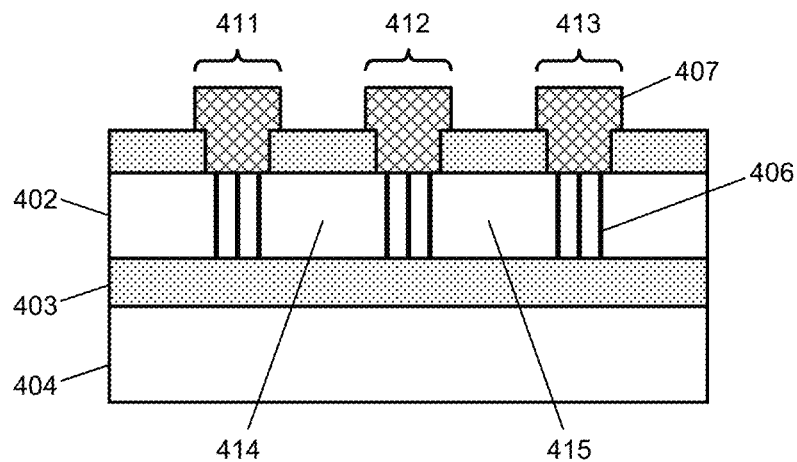
FIG. 4b shows the layer structure of an exemplary fabrication process after a metal layer is patterned.

An exemplary fabrication process to build the QWRTT is described below. FIG. 4a shows the layer structure at the step of ion implantation, and FIG. 4b shows the layer structure after a metal layer is patterned. The starting material is a silicon-on-insulator (SOI) (110) wafer 401. The wafer includes a top silicon layer 402 with a thickness of about 100 Å, a mid oxide layer 403, and a bottom silicon substrate 404. The top silicon layer 402 has a crystal lattice comprising open channels 303 (FIG. 3a). The thickness of the silicon layer 402 is generally less than 500 Å. A layer of $SiO_2$ 405 is deposited and patterned. $SiO_2$ is used as a mask for ion implantation. Ions of metals with suitable work functions are implanted vertically to the silicon wafer in the <110> direction. If wafers with other crystal orientations are used, such as (100) and (111), then the implant angle needs to be tilted accordingly to the <110> direction. The implanted ions travel along the open channels 303 shown in FIG. 3b. The channels end at the silicon-oxide interface because silicon dioxide is amorphous. After the implantation, the open channels 303 (FIG. 3a) are filled with metal atoms and quantum wires 406 are formed. The implantation damages to the silicon lattice on the surface are removed by chemical etch. A metal layer 407 is deposited and patterned for interconnection.

As shown in FIG. 4b, the emitter region 411, the base region 412, and the collector region 413 have metal quantum wires 406 embedded in a semiconductor 402. The emitter region 411 and the base region 412 are separated by the emitter barrier region 414. The collector region 413 and the base region 412 are separated by the collector barrier region 415. In some embodiments, the metal quantum wires 406 can be approximately perpendicular to the silicon layer 402.

Thus, the lengths of the metal quantum wires 406 are generally shorter than 500 Å. The emitter region 411, the base region 412, and the collector region 413 can have the same or different numbers of metal quantum wires 406 along the emitter-base-collector direction. Moreover, the metal quantum wires 406 in the emitter region 411, the base region 412, and the collector region 413 can be formed by the same or different materials.

Figure 5:
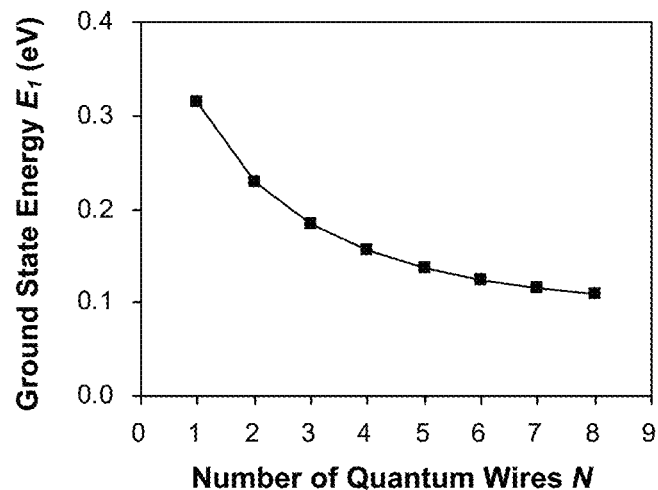
FIG. 5 shows the ground state energy $E_1$ vs. the number of quantum wires N of a superlattice structure.

The emitter/base/collector (E/B/C) regions 411-413 each can be considered as a superlattice, which is a periodic structure of metal and semiconductor. The electrons in a metal quantum wire are confined to a two-dimensional (2-D) potential well. Electrons can only have discrete energy values inside a potential well. The ground state energy $E_1$ (shown in FIGS. 2a and 2b) is found to be a function of the potential barrier height and the superlattice size. FIG. 5 shows the ground state energy $E_1$ for electrons as a function of the number of quantum wires N in a superlattice along the current flow direction (i.e., the emitter-base-collector direction). The potential barrier height $q\phi_{bn}$ is assumed to be 0.4 eV. The superlattice size is directly related to the number of quantum wires. $E_1$ is smaller for a larger superlattice with more quantum wires.

The device characteristics of a QWRTT can be obtained by solving the one-dimensional (1-D) time-independent Schrodinger equation $$-\frac{\eta^2}{2m}\frac{d^2\psi(x)}{dx^2} + U(x)\psi(x) = E\psi(x) \tag{1}$$

where $\psi(x)$ is the wave function, $U(x)$ is the potential energy, and E is the total energy. The general solution has the form $$\psi(x) = A\,e^{i\kappa x} + Be^{-i\kappa x} \tag{2}$$

where $\kappa$ is the wave number, and is given by $$\frac{\eta^2\kappa^2}{2m} = E - U(x) \tag{3}$$

The tunneling probability or transmission coefficient T is given by $$T = \left|\frac{A_C}{A_E}\right|^2 \tag{4}$$

where $A_C$ and $A_E$ are the coefficient A of the collector and emitter, respectively. According to Fermi's golden rule, the tunneling current from emitter to collector is proportional to the transmission coefficient multiplied by the occupied states in emitter and the unoccupied states in collector. The tunneling current from collector to emitter can be obtained correspondingly.

$$I_{E\to C} \propto \frac{4\pi q}{\eta}\int T\rho_E\rho_C F_E(1-F_C)dE \tag{5}$$

$$I_{C\to E} \propto \frac{4\pi q}{\eta}\int T\rho_E\rho_C F_C(1-F_E)dE \tag{6}$$

$F_E$ and $F_C$ are the Fermi-Dirac distribution functions in the emitter and collector, respectively. $\rho_E$ and $\rho_C$ are the densities of states in the emitter and collector, respectively. The density of states $\rho$ of a 1-D metal quantum wire in a potential well is given below $$\rho = \frac{1}{\pi\eta}\cdot\sqrt{\frac{m}{2(E-E_1)}} \tag{7}$$

The net tunneling current I can be written as $$I = I_{E\to C} - I_{C\to E} \propto \frac{4\pi q}{\eta}\int T\rho_E\rho_C(F_E-F_C)dE \tag{8}$$

If the E/B/C regions have the same superlattice structures (i.e., the numbers of quantum wires N and the metal work functions $E_F$ are the same in the E/B/C regions), then their $E_1$ values are the same. $E_1$ is said to be "in alignment" in the E/B/C regions. The number of quantum wires N is denoted as $N_E$, $N_B$, and $N_C$ in the E/B/C regions, respectively. The ground state energy $E_1$ is denoted as $E_{1,E}$, $E_{1,B}$, and $E_{1,C}$ in the E/B/C regions, respectively. The Schottky barrier height for electrons $q\phi_{bn}$ is denoted as $q\phi_{bn,E}$, $q\phi_{bn,B}$, and $q\phi_{bn,C}$ in the E/B/C regions, respectively. The Schottky barrier height for holes $q\phi_{bp}$ is denoted as $q\phi_{bp,E}$, $q\phi_{bp,B}$, and $q\phi_{bp,C}$ in the E/B/C regions, respectively.

Figure 6:
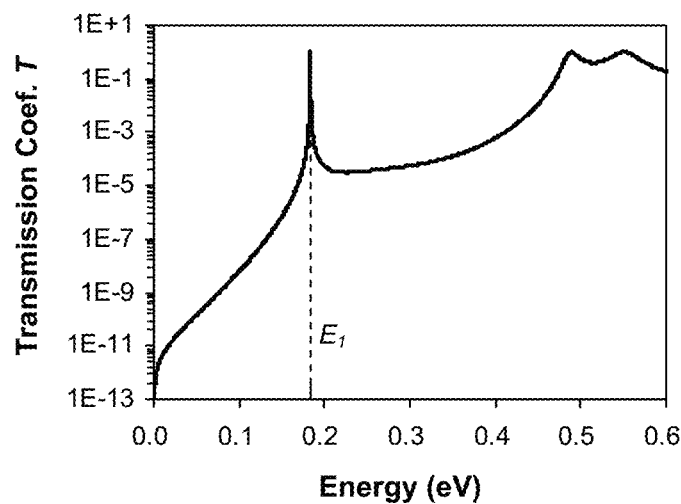
FIG. 6 shows transmission coefficient T vs. energy of an n-type QWRTT.

In some embodiments, the emitter region 111, base region 113, and collector region 115 each includes three metal quantum wires embedded in a semiconductor along the E-B-C direction. FIG. 6 shows the electron transmission coefficient T of an n-type QWRTT versus energy for $N_E = N_B = N_C = 3$, $q\phi_{bn,E} = q\phi_{bn,B} = q\phi_{bn,C} = 0.4$ eV, $W_{EB} = W_{CB} = 40$ Å, and $V_E = V_B = V_C = 0$ V. T reaches its maximum of 100% when an injected electron has energy of $E_1$. The device is said to be "in resonance", and a maximum amount of current can flow through the structure if a voltage difference is present between the emitter and collector. T decreases rapidly as the energy deviates from $E_1$.

Figure 7:
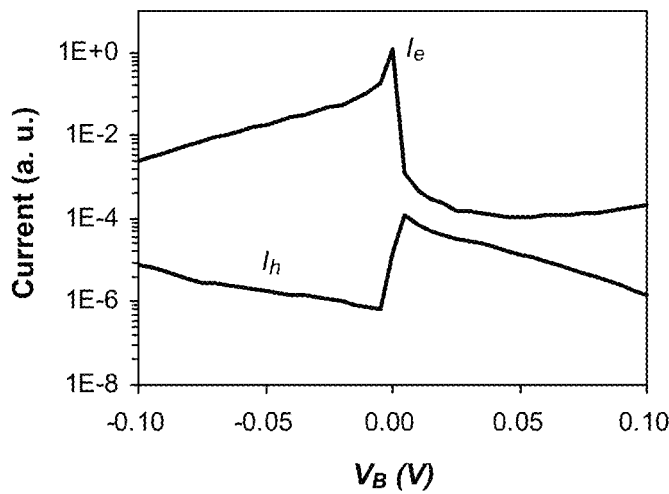
FIG. 7 shows the electron and hole tunneling currents vs. $V_B$ of an n-type QWRTT.

In some embodiments, FIG. 7 shows the electron and hole tunneling currents between the emitter terminal [102] 101 and the collector terminal 103 of an n-type QWRTT as functions of $V_B$ for $N_E = N_B = N_C = 3$, $q\phi_{bn,E} = q\phi_{bn,B} = q\phi_{bn,C} = 0.4$ eV, $W_{EB} = W_{CB} = 40$ Å, $V_E = 0$ V, and $V_C = 1$ mV. $I_e$ is the electron tunneling current from emitter to collector, and $I_h$ is the hole tunneling current from collector to emitter. Because $I_e$ and $I_h$ behave differently with respect to a change in $V_B$, the n-type device is designed so that electrons are the majority carriers and $I_h$ is always smaller than $I_e$ in the operation range. In some embodiments, the disclosed QWRTT is a normally ON transistor when $E_1$ has about the same values in the emitter region 201, the base region 203, and the collector region 205 (i.e., $E_{1,E} = E_{1,B} = E_{1,C}$ and $E_1$ is in alignment). The electron current is maximal and the device is at resonance when $V_B = 0$ V. The peak-to-valley current ratio (i.e., ON/OFF current ratio) is about four orders of magnitude. The current drops rapidly when $V_B$ is off 0 V. Swing S is defined as the change in $V_B$ that is required to change the device current by one decade. S is less than 2 mV/dec when $V_B$ is changed from 0 V to 5 mV.

The swing is required to be small so that a transistor can be switched between ON and OFF with a small voltage change. Therefore, the power supply voltage and power consumption can be reduced. The minimal subthreshold swing for a conventional MOSFET at room temperature is 60 mV/dec (discussed by K. P. Cheung in "On the 60 mV/dec @300 K limit for MOSFET subthreshold swing," Proceedings of 2010 International Symposium on VLSI Technology, System and Application, Hsinchu, 2010, pp. 72-73, doi: 10.1109/VTSA.2010.5488941). The QWRTT has a very small swing because (a) the current conduction mechanism is resonant tunneling and (b) the emitter and collector are 1-D quantum wire structures. The 1-D density of states (as shown in Eq. 7) plays an important role in the swing.

Figure 8:
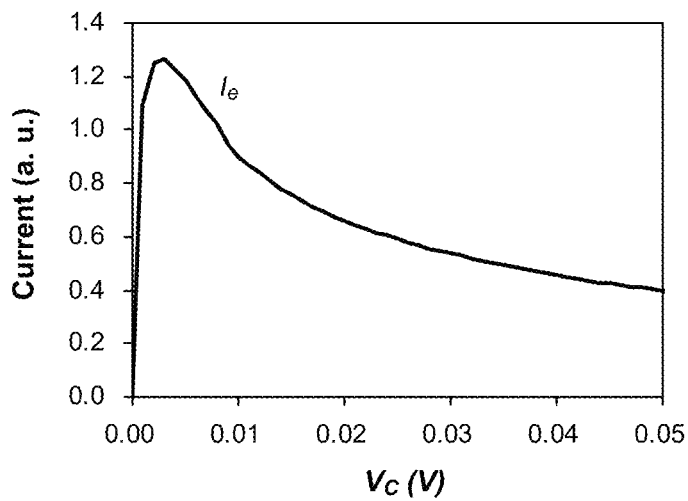
FIG. 8 shows the electron tunneling current vs. $V_C$ of an n-type QWRTT.

FIG. 8 shows the electron tunneling current of an n-type QWRTT as a function of $V_C$ for $N_E=N_B=N_C=3$, $q\phi_{bn,E}=q\phi_{bn,B}=q\phi_{bn,C}=0.4$ eV, $W_{EB}=W_{CB}=40$ Å, and $V_E=V_B=0$ V. The device is ON when $V_B=0$ V. The output characteristics show negative differential resistance (NDR). The NDR effect is due to (a) resonant tunneling and (b) 1-D density of states in the E/C regions.

Figure 9:
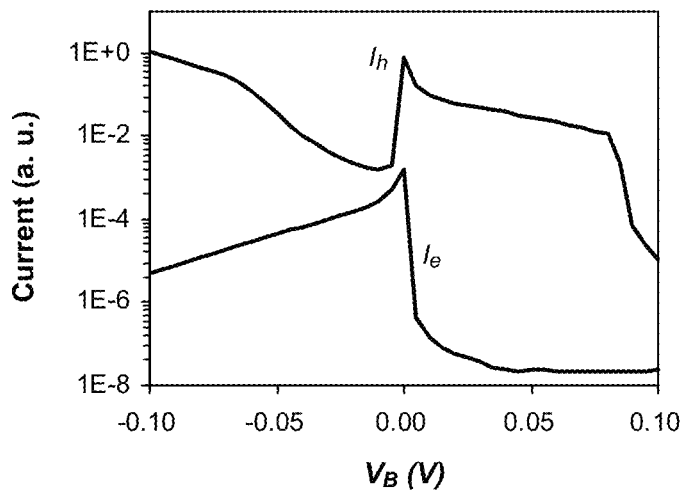
FIG. 9 shows the hole and electron tunneling currents vs. $V_B$ of a p-type QWRTT.

FIG. 9 shows the hole and electron tunneling currents of a p-type QWRTT as functions of $V_B$ for $N_E=N_B=N_C=3$, $q\phi_{bp,E}=q\phi_{bp,B}=q\phi_{bp,C}=0.26$ eV, $W_{EB}=W_{CB}=40$ Å, $V_E [=V_B] =0$ V, and $V_C=-1$ mV. The p-type QWRTT with $E_1$ in alignment is also a normally ON transistor. In a p-type QWRTT, the metal Fermi level $E_F$ is closer to the valance band edge than the conduction band edge, and the primary carriers are holes. The peak-to-valley current ratio is smaller than that of an n-type device because holes have a larger effective mass than electrons in silicon. The swing S is less than 2 mV/dec and about the same as that of an n-type device. Thus, both n- and p-type QWRTTs have the capability of switching transistor states by a small control voltage change, which can beneficially reduce the power supply voltage and power consumption.

The common practice to improve the hole mobility in p-channel MOSFETs such as compressive stress and SiGe can also be applied to p-type QWRTTs. Simulation results show that the peak-to-valley current ratio can be improved if the hole effective mass is reduced since the effective mass is the primary difference between n- and p-type devices in simulation. Ge has a higher hole mobility and a higher conduction band edge than Si. The Ge in a SiGe alloy is found to effectively improve the peak-to-valley current ratio and reduce the electron tunneling current in a p-type QWRTT. Furthermore, simulation results show that the current gain $h_{FE}$ is improved and the NDR effect is reduced for an n-type device as the Ge content in a SiGe alloy increases because Ge has a smaller electron effective mass than Si. Therefore, Ge is beneficial to both n- and p-type devices. Both Si and Ge have a diamond cubic lattice structure, so as single crystal SiGe alloys. The method of creating quantum wires by ion implantation can be applied to single crystal SiGe alloys and other crystalline lattice structures with open channels.

Figure 10A:
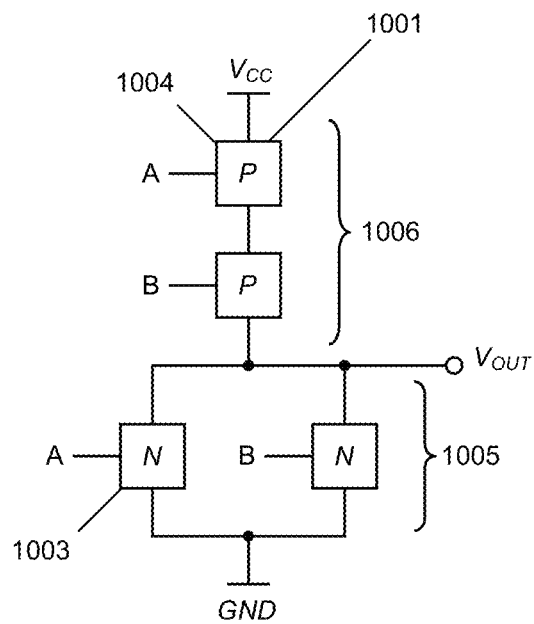
FIG. 10a shows the circuit diagram of a 2-input AND gate.
Figure 10B:
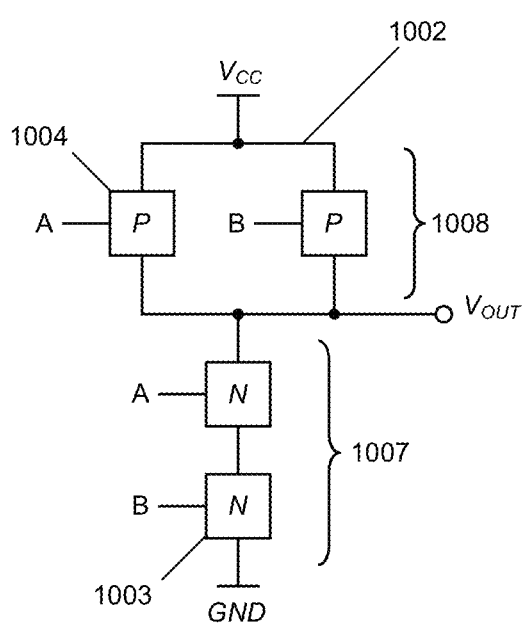
FIG. 10b shows the circuit diagram of a 2-input OR gate.

In some embodiments, the QWRTT can be configured as a normally ON transistor by having $E_1$ in alignment. FIG. 10a shows the circuit diagram of a 2-input AND gate 1001, and FIG. 10b shows the circuit diagram of a 2-input OR gate 1002. Both gates are constructed by using n- and p-type normally ON QWRTTs disclosed in the present application. Assume a high voltage (such as the power supply voltage $V_{cc}$) represents logic 1, and a low voltage (such as the ground voltage 0 V) represents logic 0. Each gate consists of a pull-up network (such as 1006 in FIGS. 10a and 1008 in FIG. 10b) and a pull-down network (such as 1005 in FIGS. 10a and 1007 in FIG. 10b). The function of the pull-up network is to provide a connection between the output and $V_{CC}$ when the output is logic 1. Similarly, the function of the pull-down network is to connect the output to ground when the output is logic 0. The pull-up network is constructed using p-type normally ON QWRTTs 1004, and the pull-down network is constructed using n-type normally ON QWRTTs 1003. The p-type QWRTTs 1004 are connected in series in the pull-up network 1006 of an AND gate as shown in FIG. 10a, and connected in parallel in the pull-up network 1008 of an OR gate as shown in FIG. 10b. The n-type QWRTTs 1003 are connected in parallel in the pull-down network 1005 of an AND gate as shown in FIG. 10a, and connected in series in the pull-down network 1007 of an OR gate as shown in FIG. 10b. The circuit configuration of the AND gate in FIG. 10a resembles a CMOS NOR gate, and the OR gate in FIG. 10b resembles a CMOS NAND gate.

Normally ON transistors with small swings are very suitable for digital circuits. The MOSFETs used in digital circuits are typically enhancement-mode transistors. The power supply voltage $V_{DD}$ and threshold voltage $V_T$ are determined by the OFF state leakage current, subthreshold swing, and ON/OFF current ratio. Since the theoretical minimum of subthreshold swing is 60 mV/dec, there is very little room to scale down $V_{DD}$ and $V_T$ in each technology node. The dynamic power consumption of a digital circuit is proportional to f-$V_{DD}^2$, in which f is the clock frequency. The power consumption increases as the clock frequency increases. The circuit performance and clock frequency are eventually limited by the power consumption. The most effective way to improve the circuit performance is lowering down the power supply voltage, so the clock frequency has more room to increase. Since the QWRTT has a much smaller swing, the circuits built with QWRTTs can operate at a smaller power supply voltage and higher clock frequency than the circuits built with MOSFETs.

Figure 11:
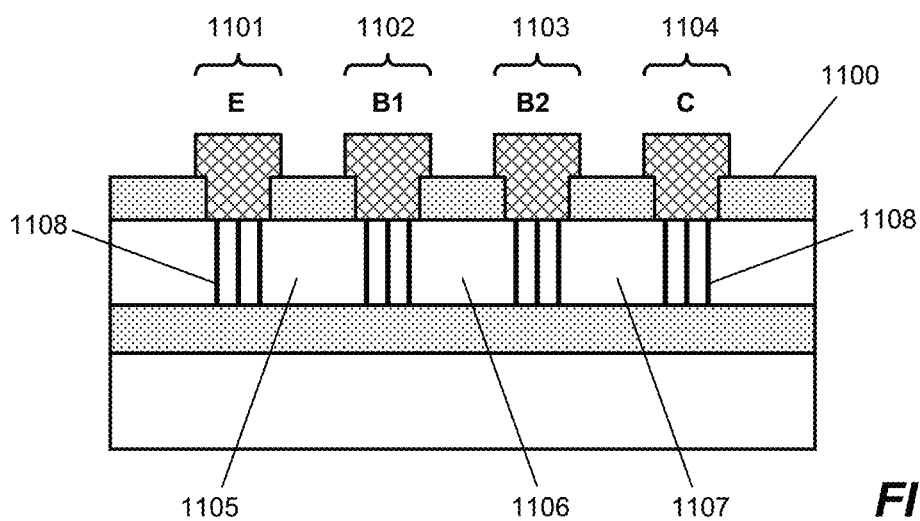
FIG. 11 shows a simplified structure of two stacked devices.

Moreover, normally ON transistors are more suitable for stacked devices than enhancement-mode MOSFETs. For a MOSFET, the threshold voltage is increased if the source and body are reverse biased. It is called body effect. Therefore, the power supply voltage $V_{DD}$ needs to be sufficiently large enough to drive stacked devices. On the other hand, a normally ON transistor is fully ON when $V_B=0$ V. There is no threshold voltage for a normally ON transistor. The power supply voltage can be small because there is no concern about the body effect. Furthermore, the device structure of stacked devices can be simplified to save device area and increase driving current. For example, FIG. 11 shows a simplified structure of a semiconductor device 1100 comprising two stacked QWRTTs. Instead of having E/B/C regions for each transistor, the two transistors in a stack can have one emitter region 1101, one collector region 1104, and two base regions 1102, 1103 in between. The emitter region 1101 and the first base region 1102 are separated by the emitter barrier region 1105. The collector region 1104 and the second base region 1103 are separated by the collector barrier region 1107. The two base regions 1102, 1103 are separated by the inter-base barrier region 1106. The emitter region 1101, the collector region 1104, and the two base regions 1102, 1103 each includes a plurality of metal quantum wires 1108.

AND and OR gates can be built by using normally ON transistors. However, {AND, OR} alone is not a functionally complete set of logic operators. The QWRTT must include enhancement-mode transistors to build inverters because {AND, NOT}, {OR, NOT}, and {AND, OR, NOT} are functionally complete.

Figure 12:
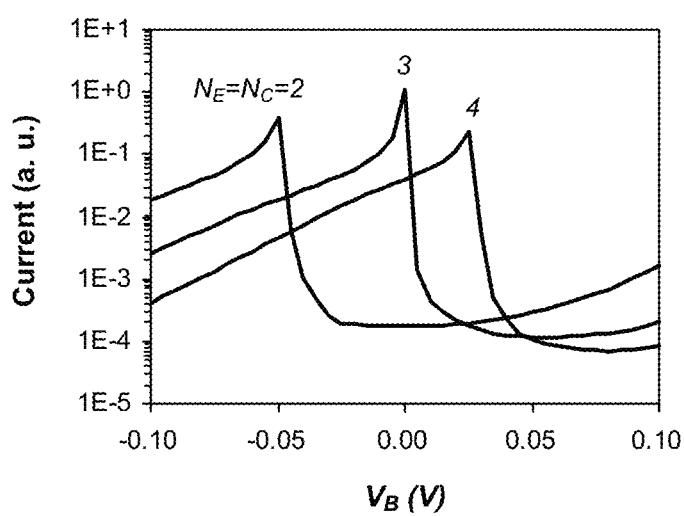
FIG. 12 shows the electron tunneling current vs. $V_B$ of an n-type QWRTT with different $N_E$ and $N_C$.
Figure 13:
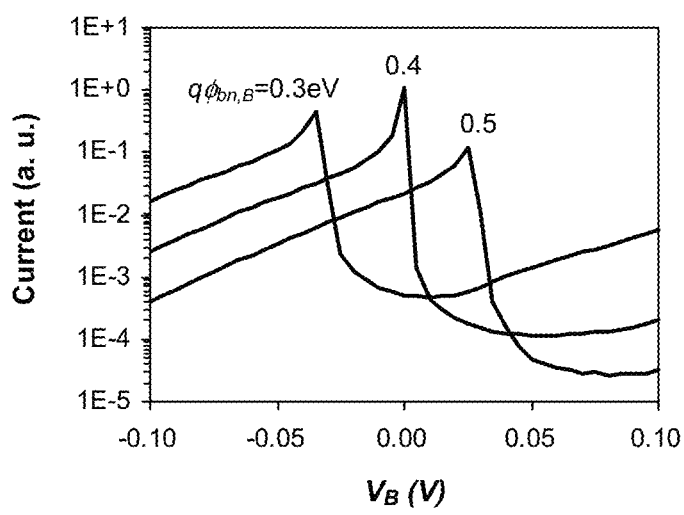
FIG. 13 shows the electron tunneling current vs. $V_B$ of an n-type QWRTT with different $q\phi_{bn,B}$.

In some embodiments, the QWRTT can be configured as an enhancement-mode transistor by having different values of $E_1$ in the E/B/C regions (i.e., $E_1$ is not in alignment). Since $E_1$ is dependent of the superlattice size and the potential barrier height, $E_1$ is not in alignment if the E/B/C superlattice structures are different. FIG. 12 shows the electron tunneling current of an n-type QWRTT as a function of $V_B$ for different $N_E$ and $N_C$, in which $N_B=3$. When $(N_E, N_B, N_C)=(2, 3, 2)$, $E_1$ is not in alignment. The transistor is OFF when $V_B=0$ V. The transistor is ON when $V_B=-0.05$ V. FIG. 13 shows the electron tunneling current of an n-type QWRTT as a function of $V_B$ for different $q\phi_{bn,B}$, in which $q\phi_{bn,E}=q\phi_{bn,C}=0.4$ eV. When $(q\phi_{bn,E}, q\phi_{bn,B}, q\phi_{bn,C})=(0.4, 0.3, 0.4)$ eV, $E_1$ is not in alignment. The transistor is OFF when $V_B=0$ V, and the transistor is turned ON when $V_B$ is negative. The n-type enhancement-mode QWRTT resembles a p-channel MOSFET, in which a device is ON when $V_B$ or $V_G$ is negative. Similarly, the p-type QWRTT can also be configured as an enhancement-mode transistor if $E_1$ is not in alignment. Therefore, the QWRTT includes the normally ON transistor family and the enhancement-mode transistor family. People can use the enhancement-mode QWRTTs to build CMOS-like logic circuits such as NAND gates and NOR gates.

The presented disclosed QWRTT has distinct and beneficial properties compared to conventional transistors such as the MOSFET, bipolar junction transistor (BJT), resonant tunneling transistor (RTT), and metal base transistor (MBT) because of the following major differences. The QWRTT has 1-D metal quantum wires in the E/B/C regions. The QWRTT has very unique device characteristics, such as a very small swing. The primary current conduction mechanism is resonant tunneling. The potential wells in the E/B/C regions are formed by metal-semiconductor Schottky barriers. Typically there is only one energy state in the E/B/C potential wells. The QWRTT includes normally ON transistor family and enhancement-mode transistor family.

The QWRTT has the following potential advantages over the MOSFET in digital circuit applications. (1) Lower Power Consumption—The QWRTT can operate at a lower power supply voltage and consume less energy because of its smaller swing. (2) Higher Speed—The device speed is higher because of larger driving current and smaller parasitic resistance. The intrinsic speed of a tunneling device is much faster than a device such as FET or BJT operating on drift or diffusion process. The current conducts through the whole barrier regions, while a MOSFET conducts current in a channel at the semiconductor surface. The E/B/C regions are made of metal quantum wires with low resistance. (3) Lower Manufacturing Cost—The fabrication process costs less because of a simpler device structure. Unlike the MOSFET, the QWRTT does not require a gate structure, shallow junction, lightly doped drain, silicide contact, etc. The number of process steps is much less than that of an advanced CMOS process. (4) Higher Density—The QWRTT has a smaller device size and a higher packing density because the device structure is simpler. The area spent on device isolation is smaller because of lower power supply voltage. (5) Better Reliability—The QWRTT does not have gate insulator related device reliability problems. (6) Better Uniformity—The QWRTT does not have statistical dopant fluctuation and line edge roughness, which are two major sources of device variations in the MOSFET.

What is claimed is:

1. A semiconductor transistor device, comprising:
   an emitter region comprising a plurality of metal quantum wires;
   a base region comprising a plurality of metal quantum wires;
   a collector region comprising a plurality of metal quantum wires;
   an emitter barrier region between the emitter region and the base region; and
   a collector barrier region between the collector region and the base region.

2. The semiconductor transistor device of claim 1, wherein the emitter region, the base region, and the collector region comprises a crystalline semiconductor that includes open channels in a crystal lattice, wherein the metal quantum wires are formed along the open channels of the crystalline semiconductor.

3. The semiconductor transistor device of claim 2, wherein the open channel direction is <110> direction for semiconductors with a diamond cubic lattice structure.

4. The semiconductor transistor device of claim 2, wherein the metal quantum wires in the emitter region, the base region, and the collector region are formed by ion implantation of metal ions respectively into the emitter region, the base region, and the collector region.

5. The semiconductor transistor device of claim 2, wherein the crystalline semiconductor is in the form of a semiconductor layer, wherein the metal quantum wires are disposed from a bottom surface of the layer to a top surface of the semiconductor layer.

6. The semiconductor transistor device of claim 5, further comprising:
   an emitter terminal connected to the emitter region;
   a base terminal connected to the base region; and
   a collector terminal connected to the collector region,
   wherein the metal quantum wires in the emitter region, the base region, and the collector region are respectively connected to the emitter terminal, the base terminal, and the collector terminal at the top surface of the semiconductor layer.

7. The semiconductor transistor device of claim 1, wherein the metal quantum wires have lengths shorter than 500 Å.

8. The semiconductor transistor device of claim 1, wherein the emitter region, the base region, and the collector region each includes a semiconductor in which the plurality of metal quantum wires are embedded.

9. The semiconductor transistor device of claim 8, wherein the semiconductor includes silicon, germanium, silicon germanium alloys, diamond, and III-V compound semiconductors.

10. The semiconductor transistor device of claim 1, wherein the plurality of metal quantum wires in the emitter region, the base region, or the collector region are substantially parallel to each other.

11. The semiconductor transistor device of claim 10, wherein the plurality of metal quantum wires in the emitter region, the base region, or the collector region are distributed periodically.

12. The semiconductor transistor device of claim 1, wherein the emitter barrier region or the collector barrier region has a width smaller than 100 Å.

13. The semiconductor transistor device of claim 1, wherein the base region is configured to produce a tunneling current through the emitter barrier region and the collector barrier region in response to a voltage applied to the base region.

14. The semiconductor transistor device of claim 1, wherein a Fermi level [work function] of the metal quantum wires is closer to the conduction band edge than to the valence band edge in at least one of the emitter barrier region or the collector barrier region, wherein a tunnel current between the emitter region and the collector region has electrons as majority carriers.

15. The semiconductor transistor device of claim 1, wherein a Fermi level [work function] of the metal quantum wires is closer to the valence band edge than to the conduction band edge in at least one of the emitter barrier region or the collector barrier region, wherein a tunnel current between the emitter region and the collector region has holes as majority carriers.

16. The semiconductor transistor device of claim 1, wherein the metal quantum wires in the emitter region, the base region, and the collector region are made of a same metal.

17. The semiconductor transistor device of claim 1, wherein the metal quantum wires in the emitter region, the base region, and the collector region are made of different metals.

18. The semiconductor transistor device of claim 1, wherein ground state energies in the metal quantum wires in the emitter region, the [emitter] base region, and the collector region have substantially a same value.

19. The semiconductor transistor device of claim 1, wherein ground state energies in the metal quantum wires in the emitter region, the [emitter] base region, and the collector region have different values.

20. A semiconductor transistor device, comprising:
an emitter region comprising a plurality of metal quantum wires;
a first base region comprising a plurality of metal quantum wires;
a second base region comprising a plurality of metal quantum wires;
a collector region comprising a plurality of metal quantum wires;
an emitter barrier region between the emitter region and the first base region;
an inter-base barrier region between the first base region and the second base region; and
a collector barrier region between the collector region and the second base region.

* * * * *